(12) United States Patent
Li et al.

(10) Patent No.: US 10,636,850 B2
(45) Date of Patent: Apr. 28, 2020

(54) ELECTROLUMINESCENT DEVICE AND METHOD FOR MANUFACTURING THE SAME AND DISPLAY DEVICE

(71) Applicant: BOE Technology Group Co., Ltd., Beijing (CN)

(72) Inventors: Wei Li, Beijing (CN); Xing Zhang, Beijing (CN); Dini Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 16/029,886

(22) Filed: Jul. 9, 2018

(65) Prior Publication Data

US 2019/0067391 A1    Feb. 28, 2019

(30) Foreign Application Priority Data

Aug. 31, 2017  (CN) .......................... 2017 1 0775984

(51) Int. Cl.
  *H01L 27/32*   (2006.01)
  *H01L 51/50*   (2006.01)
  *H01L 51/52*   (2006.01)

(52) U.S. Cl.
  CPC ...... *H01L 27/3246* (2013.01); *H01L 27/3272* (2013.01); *H01L 27/3279* (2013.01); *H01L 51/5044* (2013.01); *H01L 51/525* (2013.01); *H01L 51/5206* (2013.01); *H01L 51/5228* (2013.01); *H01L 27/322* (2013.01); *H01L 51/5284* (2013.01)

(58) Field of Classification Search
  CPC ............. H01L 27/3246; H01L 51/5044; H01L 51/5228; H01L 27/3279
  See application file for complete search history.

(56) References Cited

U.S. PATENT DOCUMENTS

| | | | | |
|---|---|---|---|---|
| 2007/0075329 | A1* | 4/2007 | Kim | H01L 27/3276 257/103 |
| 2010/0110048 | A1* | 5/2010 | Min | H01L 27/3253 345/204 |
| 2015/0318339 | A1* | 11/2015 | Nakamura | H01L 27/3262 257/98 |
| 2017/0047391 | A1* | 2/2017 | You | H01L 27/3276 |
| 2018/0013092 | A1* | 1/2018 | Park | H01L 27/3216 |

* cited by examiner

*Primary Examiner* — Abbas I Abdulselam
(74) *Attorney, Agent, or Firm* — Nath, Goldberg & Meyer; Joshua B. Goldberg

(57) ABSTRACT

The present disclosure provides an electroluminescent device, a method for manufacturing the same, and a display device. The electroluminescent device of the present disclosure includes: a first substrate and a second substrate disposed opposite to each other; a first electrode disposed on a side of the first substrate proximal to the second substrate; a main spacer disposed between the first substrate and the second substrate and configured to support the first substrate and the second substrate; a first spacer spaced apart from the main spacer disposed on the side of the second substrate proximal to the first substrate; and an auxiliary electrode layer disposed on at least part of an surface of the first spacer proximal to the first substrate, wherein at least part of the auxiliary electrode layer is in contact with the first electrode for electrical connection.

19 Claims, 2 Drawing Sheets

ELECTROLUMINESCENT DEVICE AND METHOD FOR MANUFACTURING THE SAME AND DISPLAY DEVICE

CROSS-REFERENCE TO RELATED APPLICATIONS

The present application claims the priority of Chinese Patent Application No. 201710775984.4, filed on Aug. 31, 2017, the content of which are incorporated herein in their entirety by reference.

TECHNICAL FIELD

The present disclosure belongs to the field of display technology, and more particularly, relates to an electroluminescent device, a method for manufacturing the same and a display device.

BACKGROUND

Currently, the Organic Light Emitting Diode (OLED) devices are rapidly developing in the flat panel display field owe to features such as thinness, low consumption, high response speed, and high resolution, and their potential market prospect is favored by people. In various OLED devices, a top-emitting active-matrix organic light emitting diode (AMOLED) can effectively solve the decrease in the aperture ratio and the brightness of the display due to the complex TFT (Thin Film Transistor) compensation circuit. At the same time, it can also improve the color gamut of the AMOLED display by using the microcavity effect existing in the structure of the top-emitting AMOLED device to improve the display effect.

In the top-emitting AMOLED, the light transmittance and the conductivity of the cathode thereof are important factors for its performance. Accordingly, the cathode is usually a transparent electrode made of ITO (Indium Tin Oxide).

SUMMARY

An embodiment of the present disclosure provides an electroluminescent device, including: a first substrate and a second substrate disposed opposite to each other; a first electrode disposed on a side of the first substrate proximal to the second substrate; a main spacer disposed between the first substrate and the second substrate and configured to support the first substrate and the second substrate; a first spacer spaced apart from the main spacer disposed on the side of the second substrate proximal to the first substrate; and an auxiliary electrode layer disposed on at least part of an surface of the first spacer proximal to the first substrate, wherein at least part of the auxiliary electrode layer is in contact with the first electrode for electrical connection.

Optionally, the main spacer is in a compressed state.

Optionally, the main spacer is disposed on the side of the second substrate proximal to the first substrate.

Optionally, the first spacer is in an original state or the first spacer is in an compressed state wherein the first spacer is compressed less than the difference in height between the original state of the main spacer and the compressed state of the main spacer.

Optionally, at least part of the surface of the first spacer proximal to the first substrate has an uneven structure.

Optionally, an auxiliary electrode layer is disposed on the entire surface of the first spacer, and the entire surface of the first spacer has the uneven structure.

Optionally, the uneven structure of the first spacer includes a stepped structure.

Optionally, the main spacer is made of an elastic material and the main spacer is compressible in a direction perpendicular to the first substrate and the second substrate.

Optionally, the first spacer and the main spacer are made of a same material.

Optionally, the elastic material includes at least one of resin, acrylate or rubber.

Optionally, a black matrix is further disposed between the second substrate and the main spacer and the first spacer, wherein an orthographic projection of the main spacer, the first spacer and the auxiliary electrode layer on the second substrate is within an orthographic projection of the black matrix on the second substrate.

Optionally, the black matrix has an opening area, and a color filter is disposed within the opening area.

Optionally, a planarization layer is disposed on a side of the color filter away from the second substrate, and at least one of the main spacer and the first spacer is integrated with the planarization layer.

Optionally, a material of the auxiliary electrode layer includes a metal material and the metal material includes at least one of Al, Cu or Mo.

Optionally, the auxiliary electrode layer has a thickness of about 0.42 μm to 0.48 μm.

Optionally, an anode, a plurality of pixel defining structures, and a light emitting functional layer is further disposed on the first substrate, wherein the first electrode covers the pixel defining structures and the light emitting functional layer.

Optionally, a plurality of pixel defining structures are further disposed on the first substrate, and an orthographic projection of the pixel defining structures on the second substrate is within the orthographic projection of the black matrix on the second substrate.

An embodiment of the present disclosure further provides a method for manufacturing an electroluminescent device, including steps of: forming a first electrode on a first substrate; forming a main spacer and a first spacer spaced apart from each other on the second substrate, the main spacer being made of an elastic material, and a height of the main spacer being greater than a height of the first spacer, wherein at least part of an surface of the first spacer proximal to the first substrate is covered with an auxiliary electrode layer; and aligning and assembling the first substrate with the second substrate to form a cell such that the main spacer is compressed and at least part of the auxiliary electrode layer is in contact with the first electrode for electrical connection.

Optionally, the step of forming the main spacer and the first spacer on the second substrate includes forming a planarization layer on the second substrate, and forming the main spacer and the first spacer on the planarization layer, wherein the planarization layer is integrally formed with the main spacer and the first spacer using a half-tone mask process by using a same material.

Optionally, before the step of aligning and assembling the first substrate with the second substrate to form a cell, the height of the main spacer in an original state is 0.65-0.98 μm higher than the sum of the height of the first spacer in the original state and a height of the auxiliary electrode layer in a direction perpendicular to the first substrate and the second substrate.

Optionally, the elastic material for forming the main spacer includes at least one of resin, acrylate, or rubber.

An embodiment of the present disclosure further provides a display device, including the electroluminescent device described above.

DETAILED DESCRIPTION

For the purpose of better understanding of the technical solutions of the present disclosure by those skilled in the art, the present disclosure will be further described in detail below in conjunction with the accompanying drawings and detailed description.

In some cases, the conductivity of the ITO in the top-emitting AMOLED is insufficient and the conductivity can be increased by way of an auxiliary cathode. For example, ITO may be connected to the cathode by disposing the ITO on a photo spacer in order to increase conductivity. However, in this case, the photo spacer has a risk of breaking, so that the auxiliary cathode cannot function effectively.

Figure 1:
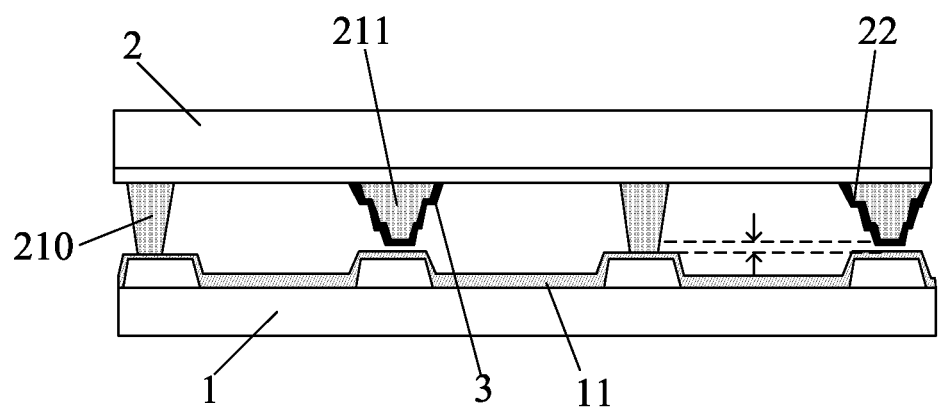
FIG. 1 is a schematic structural diagram of an electroluminescent device according to an embodiment of the present disclosure.
Figure 2:
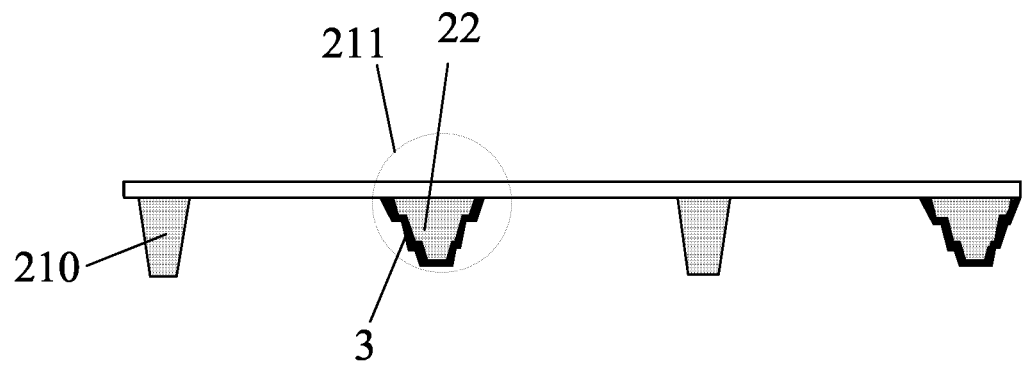
FIG. 2 is a schematic structural diagram of part of an electroluminescent device according to an embodiment of the present disclosure.

To this end, an embodiment of the present disclosure provides an electroluminescent device, as shown in FIGS. 1 and 2, the electroluminescent device includes: a first substrate 1 and a second substrate 2 disposed opposite to each other; a first electrode 11 disposed on a side of the first substrate 1 proximal to the second substrate 2; a main spacer 210 disposed between the first substrate 1 and the second substrate 2 and configured to support the first substrate 1 and the second substrate 2; a first spacer 211 spaced apart from the main spacer 210 disposed on the side of the second substrate 2 proximal to the first substrate 1; and an auxiliary electrode layer 3 disposed on at least part of an surface of the first spacer 211 proximal to the first substrate 1, wherein at least part of the auxiliary electrode layer 3 is in contact with the first electrode 11 for electrical connection. In an embodiment, the main spacer 210 is in a compressed state. In another embodiment, the main spacer 210 is disposed on the side of the second substrate 2 proximal to the first substrate. It is to be noted that, in the present disclosure, a state where the main spacer 210 and the first spacer 211 are not compressed may be referred to as an original state, and the state where they are compressed may be referred to as a compressed state.

Figure 5:
FIG. 5 is a schematic diagram of uneven structures of a first spacer of an electroluminescent device according to an embodiment of the present disclosure.

The auxiliary electrode layer 3 may partially cover or completely cover the surface of the first spacer 211, as long as it is ensured that the auxiliary electrode layer is in contact with the first electrode after the first substrate and the second substrate are aligned and assembled with each other. In an embodiment of the present disclosure, the auxiliary electrode layer 3 is disposed at least on part of the surface of the first spacer 211 proximal to the first substrate 1, and the at least part of the surface of the first spacer 211 proximal to the first substrate 1 has an uneven structure 22. For example, the auxiliary electrode layer 3 may be provided on the entire surface of the first spacer 211, and the entire surface of the first spacer 211 may have an uneven structure 22. Referring to FIG. 5, the uneven structure 22 includes but is not limited to the following items as shown in the cross-sectional views of FIG. 5: an irregular surface a, an arc surface b, a surface c for a three-step structure and a concave-convex surface d.

In an embodiment of the present disclosure, the main spacer 210 with a larger height mainly plays a supporting role. For example, when subjected to pressure, the main spacer 210 with larger height may provide support and buffer the pressure, so as to protect the on the uneven structure 22 from breaking when the auxiliary electrode layer 3 comes into contact with the first electrode 11 on the first substrate 1. The polarity of the auxiliary electrode layer 3 is the same as the polarity of the first electrode 11, so that the conductivity of the entire first electrode 11 can be enhanced. The main spacers 210 are disposed spaced apart from the first spacers 211 in FIG. 2. It can be understood that, the relative arrangement density or ratio of the main spacers and the first spacers may be selected according to actual conduction requirements.

Optionally, the uneven structure 22 of the first spacer 211 is a stepped structure.

In an embodiment of the present disclosure, the surface of the first spacer 211 in contact with the auxiliary electrode layer 3 is designed to be a rough surface so as to facilitate attachment of an auxiliary electrode material. In some cases, the uneven structure 22 of the first spacer 211 may be provided to be a stepped structure (for example, a structure whose cross-sectional view is a three-step structure as shown in FIG. 5c). In a case where the uneven structure 22 of the first spacer 211 is provided to be a stepped structure which is uneven, the surface of the auxiliary electrode material that is in contact with the first electrode may be a flat surface in order to better electrically connect to the first electrode.

In an embodiment of the present disclosure, the main spacer 210 is made of an elastic material and is compressible in a direction perpendicular to the first substrate 1 and the second substrate 2. Optionally, the main spacer 210 and the first spacer 211 may be made of a same material. Optionally, the elastic material may include at least one of resin, acrylate or rubber.

Figure 6:
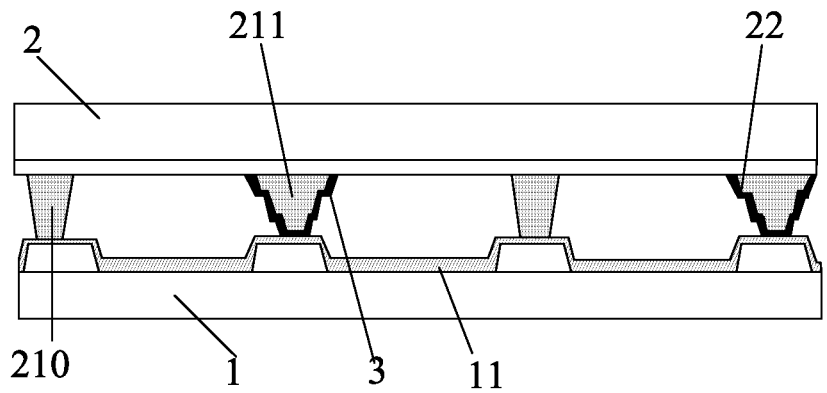
FIG. 6 is a schematic structural diagram of an electroluminescent device according to an embodiment of the present disclosure.

In an embodiment of the present disclosure, when the main spacer 210 is under pressure, the resiliency of the main spacer 210 may cause the pressure to be gradually released within a certain period of time, so that the first spacer 211 with a lower height may be prevented from cracking under instantaneous pressure. For example, refer to FIG. 6 which shows a schematic diagram of a structure formed after the first substrate 1 and the second substrate 2 are aligned and assembled to form a cell. The elastic main spacer 210 is compressed to a height equal to the sum of the height of the first spacer 211 and the thickness (height) of the auxiliary electrode layer 3, so that the auxiliary electrode layer 3 is in contact with the first electrode 11 for electrical connection. In this case, the main spacer is pressed to have a certain amount of compression, and the amount of compression of the main spacer=the height of the main spacer in an original state–the height of the first spacer in the original state–the thickness (height) of the auxiliary electrode layer. In other words, the amount of compression of the main spacer is the difference between the height of the main spacer in an original state and the sum of the height of the first spacer in the original state and the thickness (height) of the auxiliary electrode layer.

In an embodiment of the present disclosure, in a direction perpendicular to the first substrate 1 and the second substrate 2, the height of the main spacer 210 in an uncompressed state is greater than the sum of the height of the first spacer 211 and the thickness (height) of the auxiliary electrode layer by 0.65 µm to 0.98 µm, and when the first substrate and the second substrate are aligned and assembled to form a cell, the main spacer 210 can be compressed by 0.65 µm to 0.98 µm.

Optionally, the difference between the height of the main spacer 210 and the sum of the height of the first spacer 211 and the thickness (height) of the auxiliary electrode layer (the distance illustrated by the arrow in FIG. 1) is in the range of 0.65 µm to 0.98 µm. In this way, the overall thickness of the electroluminescent device will not be significantly increased, and the main spacer 210 can be ensured to provide sufficient support, so as to prevent the first spacer 211 from cracking under instantaneous pressure.

It should be noted that, the auxiliary electrode layer 3 may be made of a transparent conductive material such as indium tin oxide (ITO); alternatively, a metal material with a relatively high conductivity may also be used. For example, the metal material may include at least one of Al, Cu and Mo.

In an embodiment of the present disclosure, the auxiliary electrode layer 3 may have a sandwich structure such as a structure in which two layers of molybdenum sandwich one layer of aluminum or copper. Of course, other conductive metal layers may also be used.

Optionally, the auxiliary electrode layer 3 has a thickness of about 0.42 µm to 0.48 µm.

In an embodiment of the present disclosure, the material would be wasted if the auxiliary electrode layer 3 is too thick, while the conductivity would not be good if the auxiliary electrode layer 3 is too thin. The auxiliary electrode layer 3 with a thickness of about 0.42 µm to 0.48 µm can enhance the conductivity without wasting material after being in contact with the first electrode 11 for electrical connection.

In an embodiment of the present disclosure, the first substrate 1 and the second substrate 2 are the back plate and the cover plate of the OLED, respectively. The polarity of the auxiliary electrode layer 3 is the same as the polarity of the first electrode 11. For example, the first electrode 11 is a cathode of the OLED, and the auxiliary electrode layer 3 is an auxiliary cathode. A black matrix 23 is further disposed on a side of the second substrate 2 proximal to the first substrate 1, and an orthographic projection of the main spacer 210, the first spacer 211 and the auxiliary electrode layer 3 on the second substrate 2 falls within an orthographic projection of the black matrix 23 on the second substrate 2. The black matrix 23 has an opening area, and a color filter 24 is disposed in the opening area.

Figure 3:
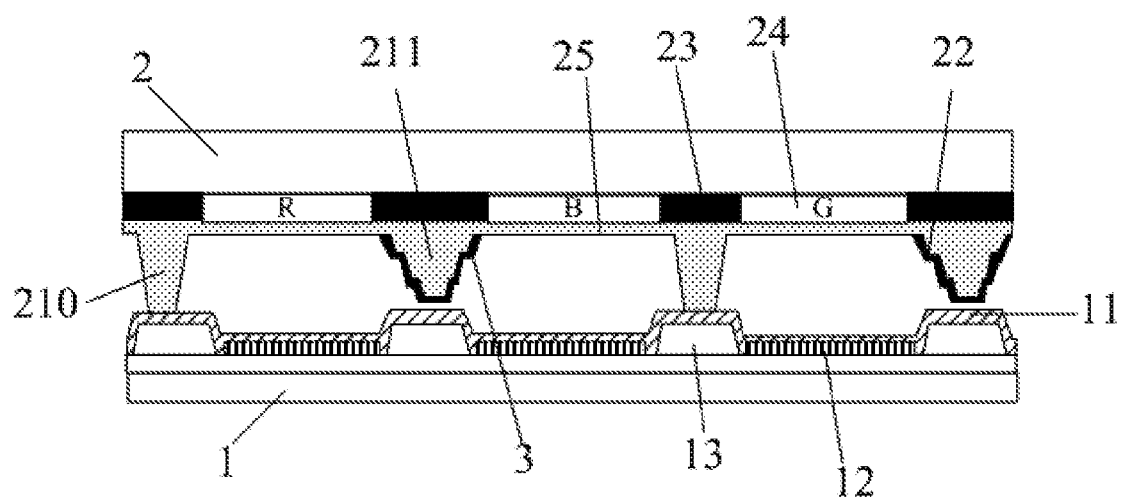
FIG. 3 is a schematic structural diagram of an electroluminescent device according to an embodiment of the present disclosure.
Figure 4:
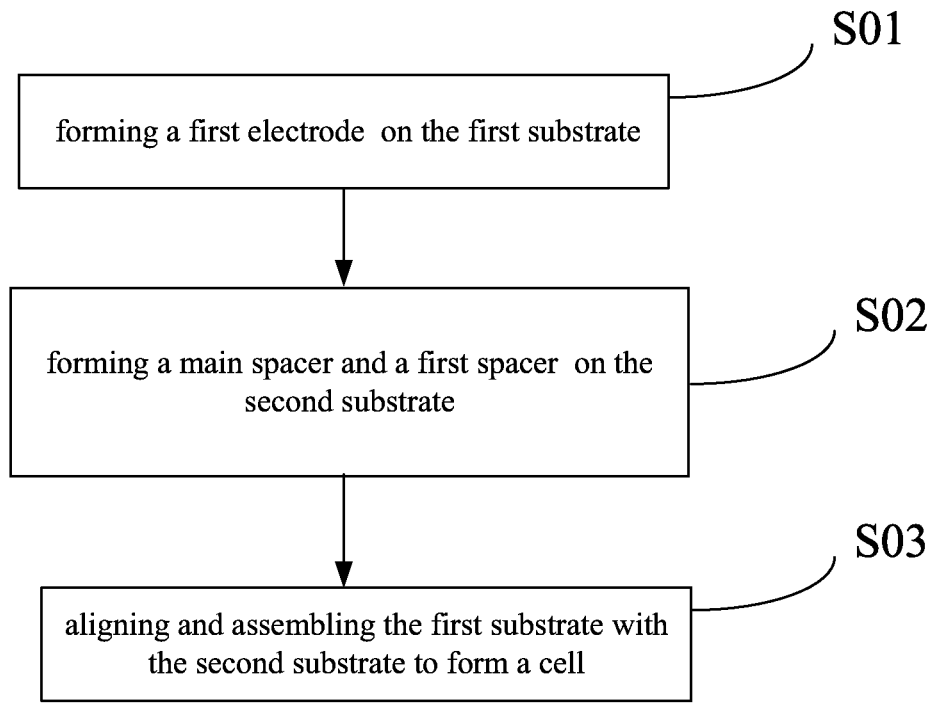
FIG. 4 is a schematic flowchart of a manufacturing method of an electroluminescent device according to an embodiment of the present disclosure.

Referring to FIG. 3, a black matrix 23 and color filters 24 are disposed on the light incident surface of the second substrate 2. In general, the black matrix 23 is in the same layer as the color filters 24. The black matrix 23 has openings arranged in an array, and the color filters 24 are disposed in the openings. It can be understood that, the thicknesses of the black matrix 23 and the color filters 24 may be adjusted depending on actual display products and are not defined here. Since the main spacer 210 and the auxiliary electrode layer 3 are opaque, they are restrained to the area covered by the black matrix 23 so as not to affect the product aperture ratio.

FIG. 3 also shows that a planarization layer 25 is disposed on a side of the color filters 24 away from the second substrate 2.

Optionally, the main spacer 210 and the first spacer 211 are formed on the planarization layer 25, and the planarization layer 25 is integrated with the main spacer 210 and the first spacer 211.

In an embodiment of the present disclosure, the main spacers 210, the first spacers 211 and the planarization layer 25 may be formed in a same step using a same process and a same material. A process like this can be referred to as an integrally forming process, and components formed by this process, for example, the main spacers 210 and the first spacers 211, can be referred to as being integrated with each other. Such implementation has a simple process, saves process steps, and is suitable for assembly line production.

In an embodiment of the present disclosure, an anode, a plurality of pixel defining structures 13, and a plurality of light emitting functional layers 12 are disposed on the first substrate 1, and the first electrode 11 covers the pixel defining structures 13 and the light emitting functional layers 12.

FIG. 3 also shows that the light emitting functional layers 12 correspond to the color filters 24. For example, each portion of the light emitting functional layer 12 that is spaced apart by the pixel defining structures 13 has a one-to-one correspondence with each of the color filters 24.

Optionally, an orthographic projection of the pixel delimiting structures 13 on the second substrate 2 falls within the orthographic projection of the black matrix 23 on the second substrate 2.

In an embodiment of the present disclosure, since the pixel defining structures 13 are opaque, the pixel defining structures 13 are restrained within the area covered by the black matrix 23 so as not to affect the product aperture ratio.

In summary, in the electroluminescent device according to embodiments of the present disclosure, the first spacer on the second substrate has an uneven structure, which facilitates the attachment of the auxiliary electrode material; the height of the first spacer is different from that of the main spacer, and the main spacer with a larger height mainly plays a supporting role. When subjected to pressure, the main spacer with a larger height can play a role of supporting and buffering the pressure, so that the auxiliary electrode layer is protected and prevented from cracking when coming into contact with the first electrode on the first substrate. The contact also enhances the conductivity of the entire first electrode. The electroluminescent device of the present disclosure is applicable to various display devices.

An embodiment of the present disclosure also provides a method for manufacturing an electroluminescent device. The electroluminescent device to be manufactured includes a first substrate 1 and a second substrate 2. In this method, the first substrate 1 and the second substrate 2 are manufactured separately, and then are aligned and assembled to form a cell. The method may include the following steps S01 to S03.

At step S01, a first electrode 11 is formed on the first substrate 1. It is to be noted that the structure on the first substrate 1 further includes a driver circuit layer, a pixel defining structure 13, and a light emitting functional layer 12. The first electrode 11 may also be referred to as a first electrode layer. Step S01 specifically includes the following steps S01a to S01e.

At step S01a, a substrate of the first substrate 1 is cleaned; then, a preparation process of TFT of the driver circuit layer is performed on the substrate of the first substrate 1.

At step S01b, a layer of photo-curing material with a thickness of 1.6 µm to 2.0 µm is coated by spin coating, and a pixel defining structure is formed after pre-baking, exposure, development, post-baking, and patterning processes.

At step S01c, an anode layer (not shown in the drawings) is formed by a sputtering process. The anode layer may be composed of three layers, namely, one ITO layer, one Ag layer, and one ITO layer with thicknesses of 80 angstroms, 1000 angstroms, and 120 angstroms, respectively.

At step S01d, the light emitting functional layer 12 is formed by evaporation.

At step S01e, a first electrode layer, i.e., a cathode layer, made of IZO, is formed by a sputtering process. The first electrode layer covers the pixel defining structure and the light emitting functional layer.

At step S02, the main spacers 210 and the first spacers 211 spaced apart from each other are formed on the second substrate 2. The main spacer 210 is made of an elastic material. The height of the main spacer 210 is greater than the height of the first spacer 211, and at least part of an surface of the first spacer proximal to the first substrate is covered with the auxiliary electrode layer 3. It should be noted that the structure on the second substrate 2 also includes a black matrix 23, a color filter 24, and a planarization layer 25. Step S02 specifically includes the following steps S02a to S02d.

At step S02a, a substrate of the second substrate 2 is cleaned; then, the black matrix 23 is formed thereon.

At step S02b, a material for the color filter 24 is applied by spin coating to have a thickness of 2.0 µm; the color filter 24 is obtained after pre-baking, exposure, development, post-baking, and patterning processes.

At step S02c, a photo-curing material is applied by spin coating, and the planarization layer 25 covering the color filter 24 as well as the main spacers 210 and the first spacers 211 are formed by a exposure process using a half-tone mask. Here, the planarization layer 25, the main spacers 210 and the first spacers 211 may be integrally formed. For example, the main spacers 210 and the first spacers 211 may be formed on the planarization layer 25.

At step S02d, two layers of molybdenum metal layers sandwiching one layer of copper are formed using a sputtering process, then a photoresist is applied, and patterning is performed to form an auxiliary electrode layer 3.

At step S03, the first substrate 1 and the second substrate 2 are aligned and assembled to form a cell to obtain the top-emitting AMOLED device. After the first substrate 1 and the second substrate 2 are aligned and assembled to form a cell, the main spacer 210 is compressed and at least part of the auxiliary electrode layer 3 is in contact with the cathode for electrical connection.

In the above steps, before the first substrate 1 and the second substrate 2 are aligned and assembled to form a cell, the height of the main spacer in an original state is higher than the sum of the height of the first spacer in the original state and the height of the auxiliary electrode layer by 0.65 µm to 0.98 µm in the direction perpendicular to the first substrate and the second substrate.

In the above steps, optionally, the first spacer 211 may be made of the same material as the main spacer 210, and the material may include at least one of resin, acrylate or rubber. It can be understood that many variations can be made to the specific implementations of the above embodiments. For example, the specific implementation process of each structural layer may be modified as needed, and each structural layer may be adjusted according to product requirements.

An embodiment of the present disclosure also provides a display device including any of the electroluminescent devices described above. The display device may be at least one of an electronic paper, an OLED panel, a cell phone, a tablet computer, a television, a display, a notebook computer, a digital photo frame, a navigation device, and any product or component with display function.

It can be understood that the above embodiments are merely exemplary embodiments for illustrating the principle of the present disclosure, and the present disclosure is not limited thereto. Various variations and improvements may be made by a person of ordinary skill in the art without departing from the spirit and essence of the present disclosure, and these variations and improvements are also considered to be within the protection scope of the present disclosure.

What is claimed is:

1. An electroluminescent device, comprising:
a first substrate and a second substrate disposed opposite to each other;
a first electrode disposed on a side of the first substrate proximal to the second substrate;
a main spacer disposed between the first substrate and the second substrate and configured to support the first substrate and the second substrate;
a first spacer spaced apart from the main spacer disposed on a side of the second substrate proximal to the first substrate; and
an auxiliary electrode layer disposed on at least part of a surface of the first spacer proximal to the first substrate,
wherein at least part of the auxiliary electrode layer is in contact with the first electrode for electrical connection, a black matrix is disposed between the second substrate and the main spacer, and between the second substrate and the first spacer, and an orthographic projection of the main spacer, the first spacer and the auxiliary electrode layer on the second substrate is within an orthographic projection of the black matrix on the second substrate.

2. The electroluminescent device according to claim 1, wherein the main spacer is in a compressed state.

3. The electroluminescent device according to claim 1, wherein the main spacer is disposed on the side of the second substrate proximal to the first substrate.

4. The electroluminescent device according to claim 1, wherein the first spacer is in an original state or the first spacer is in an compressed state, and the first spacer is compressed less than the difference in height between an original state of the main spacer and a compressed state of the main spacer.

5. The electroluminescent device of claim 1, wherein the at least part of the surface of the first spacer proximal to the first substrate has an uneven structure.

6. The electroluminescent device according to claim 5, wherein an auxiliary electrode layer is disposed on the entire surface of the first spacer proximal to the first substrate, and the entire surface of the first spacer proximal to the first substrate has the uneven structure.

7. The electroluminescent device of claim 5, wherein the uneven structure of the first spacer comprises a stepped structure.

8. The electroluminescent device according to claim 1, wherein the main spacer is made of an elastic material and the main spacer is compressible in a direction perpendicular to the first substrate and the second substrate.

9. The electroluminescent device according to claim 8, wherein the first spacer and the main spacer are made of a same material.

10. The electroluminescent device according to claim 9, wherein the elastic material comprises at least one of resin, acrylate or rubber.

11. The electroluminescent device according to claim 1, wherein the black matrix has an opening area, and a color filter is disposed within the opening area.

12. The electroluminescent device according to claim 11, wherein a planarization layer is disposed on a side of the color filter away from the second substrate, and at least one of the main spacer and the first spacer is integrated with the planarization layer.

13. The electroluminescent device according to claim 1, wherein a material of the auxiliary electrode layer comprises a metal material and the metal material comprises at least one of Al, Cu or Mo.

14. The electroluminescent device according to claim 1, wherein the auxiliary electrode layer has a thickness of about 0.42 μm to 0.48 μm.

15. The electroluminescent device according to claim 1, wherein an anode, a plurality of pixel defining structures, and a light emitting functional layer are further disposed on the first substrate, and the first electrode covers the pixel defining structures and the light emitting functional layer, and wherein an orthographic projection of the pixel defining structures on the second substrate is within the orthographic projection of the black matrix on the second substrate.

16. A display device, comprising the electroluminescent device according to claim 1.

17. A method for manufacturing an electroluminescent device, comprising steps of:
forming a first electrode on a first substrate;
forming a main spacer and a first spacer spaced apart from each other on a second substrate, the main spacer being made of an elastic material, and a height of the main spacer being greater than a height of the first spacer, wherein at least part of a surface of the first spacer proximal to the first substrate is covered with an auxiliary electrode layer; and
aligning and assembling the first substrate with the second substrate to form a cell such that the main spacer is compressed and at least part of the auxiliary electrode layer is in contact with the first electrode for electrical connection,
wherein the method further comprises: forming a black matrix between the second substrate and the main spacer and between the second substrate and the first spacer, and
an orthographic projection of the main spacer, the first spacer and the auxiliary electrode layer on the second substrate is within an orthographic projection of the black matrix on the second substrate.

18. The method for manufacturing an electroluminescent device according to claim 17, wherein the step of forming the main spacer and the first spacer on the second substrate comprises forming a planarization layer on the second substrate, and forming the main spacer and the first spacer on the planarization layer, wherein the planarization layer is integrally formed with the main spacer and the first spacer using a half-tone mask process by using a same material.

19. The method for manufacturing an electroluminescent device according to claim 17, wherein before the step of aligning and assembling the first substrate with the second substrate to form a cell, the height of the spacer in an original state is 0.65-0.98 μm higher than the sum of the height of the first spacer in the original state and a height of the auxiliary electrode layer in a direction perpendicular to the first substrate and the second substrate.

* * * * *